United States Patent
Valenzuela

(10) Patent No.: US 11,729,945 B2
(45) Date of Patent: Aug. 15, 2023

(54) ACTIVE DEVICE WITH HEAT SINK AND LOW MECHANICAL STRESS

(71) Applicant: MIKROS TECHNOLOGIES LLC

(72) Inventor: Javier A. Valenzuela, Grantham, NH (US)

(*) Notice: Subject to any disclaimer, the term of this patent is extended or adjusted under 35 U.S.C. 154(b) by 636 days.

(21) Appl. No.: 16/662,207

(22) Filed: Oct. 24, 2019

(65) Prior Publication Data

US 2020/0137924 A1   Apr. 30, 2020

Related U.S. Application Data

(60) Provisional application No. 62/750,592, filed on Oct. 25, 2018, provisional application No. 62/750,585, filed on Oct. 25, 2018.

(51) Int. Cl.
*H05K 3/34* (2006.01)
*H05K 7/20* (2006.01)
(Continued)

(52) U.S. Cl.
CPC ........ *H05K 7/20263* (2013.01); *H01S 3/0405* (2013.01); *H05K 3/321* (2013.01); *H05K 3/34* (2013.01)

(58) Field of Classification Search
CPC ...... H05K 7/20263; H05K 3/321; H05K 3/34; H05K 3/3468; H05K 3/38; H01S 3/0405; H01S 3/0401; H01S 3/042; H01L 23/42
See application file for complete search history.

(56) References Cited

U.S. PATENT DOCUMENTS

| 7,353,859 B2 | 4/2008 | Stevanovic et al. |
| 2013/0014916 A1 | 1/2013 | Wadley et al. |

(Continued)

FOREIGN PATENT DOCUMENTS

| JP | H11121889 A | * | 4/1999 | ........... H05K 3/0058 |
| JP | 5050440 B2 | * | 10/2012 | ............. H01L 24/32 |
| WO | WO-2007001456 A1 | * | 1/2007 | ........... H01L 23/473 |

OTHER PUBLICATIONS

Joly, S, et al. A Quantitative Thermal and Thermomechanical Analysis for Design Optimization and Robustness Assessment of Microassembled High Power Yb:CaF2 Thin-Disk Laser. Optics and Laser Technology. Mar. 22, 2018, vol. 105; pp. 229-241; https://doi.org/10.1016/j.optlastec2018.02.054; Abstract; p. 229, Right Column, Second Paragraph; p. 230, Figure 1; p. 230, Right Column, Second Paragraph; p. 230, Figure 1; p. 231, Right Column, Third Paragraph; p. 232, Figure 2; p. 233, Left Column, Third Paragraph; p. 233, Right Column, Step 2; p. 234, Left Column, Third Paragraph; p. 237, Left Column, Second Paragraph; p. 237, Right Column, Second Paragraph; p. 239, Left Column, Second Paragraph; p. 239, Right Column, First Paragraph.

*Primary Examiner* — Natalie Huls
*Assistant Examiner* — James I Burris
(74) *Attorney, Agent, or Firm* — Aspiro Legal, LLC

(57) ABSTRACT

An active device with a heat sink and low mechanical stress comprises a heat-producing substrate having a first thermal expansion coefficient; a heat sink having a second thermal expansion coefficient, wherein the first and second thermal expansion coefficients are different; and an interface between the heat-producing substrate and the heat sink formed so that, when the heat-producing substrate is operating at a predetermined temperature, a mechanical stress between the heat-producing substrate and the heat sink is substantially minimized. The heat sink has a yield strength that is lower than a yield strength of the heat-producing substrate and has been plastically deformed during fabrication to minimize the stress between the heat-producing substrate and the heat sink. Methods for fabricating the device are also disclosed.

9 Claims, 5 Drawing Sheets

(51) Int. Cl.
*H05K 3/32* (2006.01)
*H01S 3/04* (2006.01)

(56) References Cited

U.S. PATENT DOCUMENTS

2017/0018906 A1\* 1/2017 Komissarov ........ H01S 5/02476
2017/0271239 A1\* 9/2017 Morozumi .......... H01L 23/4006

\* cited by examiner

ACTIVE DEVICE WITH HEAT SINK AND LOW MECHANICAL STRESS

RELATED APPLICATIONS

This patent claims priority to and benefit of U.S. Provisional Application No. 62/750,585 (filed Oct. 25, 2018) and U.S. Provisional Application No. 62/750,592 (filed Oct. 25, 2018). The applications listed in this section are incorporated here by reference in their entirety.

FIELD

This disclosure relates to heat sinks and, more specifically, low mechanical-stress heat sinks for laser crystals or other heat generating substrates.

BACKGROUND

Diode pumped slab lasers have a planar geometry and are fabricated out of a ceramic, such as Yb:YAG, which has a low coefficient of thermal expansion ("CTE") (8 ppm/° K). Light from the diode pumps is injected on one edge of the crystal and a laser beam exits the opposite edge of the crystal. The lasing process generates substantial waste heat which must be removed from the laser crystal during operation. Heat sinks may be attached to the crystal to remove the waste heat.

Semiconductor dies have a planar geometry and are fabricated out of a semiconductor ceramic, such as Silicon, which has a low coefficient of thermal expansion (4 ppm/° K). Electrical current is fed into and out of the die through metalized areas covering most of the die face area. Substantial waste heat must be removed from the device during operation. Heat sinks may be attached to the die to remove the waste heat.

Because of the high current and high-power dissipation, both the current and the heat must be transferred through the faces of the die. For example, an IGBT semiconductor die having a face area 1 cm2 may use 100 A of current at a voltage drop of 2.7 V, requiring 270 W of heat removal. Copper and aluminum are the preferred materials for the power electrodes and the heat sinks because of their low electrical resistance, high thermal conductivity, and acceptable price. However, both metals have a coefficients of thermal expansion (CTE) four times larger than that of silicon. Thus, when a copper or aluminum heat sink that is mechanically fastened to a silicon die expands, it can cause mechanical stress and potentially damage the die.

Special care must be taken in the design of the package to control the magnitude of the thermal stresses induced during operation. The cyclic thermal stresses as the power switches are turned on and off are the principal cause of failure in power electronic devices.

SUMMARY

In an embodiment, a method of producing a device with a low-stress thermal interface comprises heating a heat-producing body to a predetermined temperature; heating a thermally conductive material to the predetermined temperature; adhering the thermally conductive material to the heat-producing body with an adhesive material; allowing the adhesive to set while the heat-producing body and the thermally conductive material cool from the predetermined temperature; and cooling the heat-producing body and the thermally conductive material so that the thermally conductive material plastically deforms. The predetermined temperature is above a melting point of the adhesive material. The thermally conductive material has a yield strength that is lower than a yield strength of the heat-producing body.

In another embodiment, a device comprises: a heat-producing substrate having a first thermal expansion coefficient; a heat sink having a second thermal expansion coefficient, wherein the first and second thermal expansion coefficients are different; and an interface between the heat-producing substrate and the heat sink formed so that, when the heat-producing substrate is operating at a predetermined temperature, a mechanical stress between the heat-producing substrate and the heat sink is substantially minimized. The heat sink has a yield strength that is lower than a yield strength of the heat-producing substrate and has been plastically deformed during fabrication to minimize the stress between the heat-producing substrate and the heat sink.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

The examples of the device discussed herein are not limited in application to the details of construction and the arrangement of components set forth in the following description or illustrated in the accompanying drawings. One of skill in the art will understand that the device is capable of implementation in other embodiments and of being practiced or carried out in various ways. Examples of specific embodiments are provided here for illustrative purposes only and are not intended to be limiting. Also, the phraseology and terminology used here is for the purpose of description and should not be regarded as limiting. Any references to examples, embodiments, components, elements or acts of the device herein referred to in the singular may also embrace embodiments including a plurality, and any references in plural to any embodiment, component, element or act herein may also embrace embodiments including only a singularity (or unitary structure). References in the singular or plural form are not intended to limit the disclosed technology, its components, acts, or elements. The word "or" may be construed as inclusive so that any terms described using "or" may indicate any of a single, more than one, and/or all the described terms.

Figure 1:
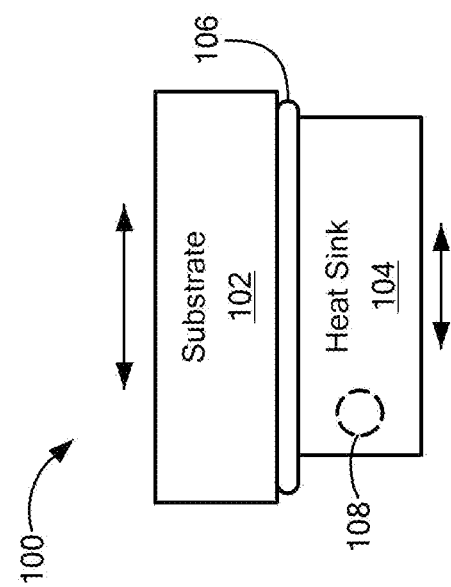
FIG. 1 is a block diagram of a device including a substrate and a heat sink.

FIG. 1 is a block diagram of a device including a heat-producing body or substrate 102 and a heat sink 104 formed from a thermally conductive material such as copper or aluminum. Substrate 102 and heat sink 104 are coupled together with an adhesive 106, which, in embodiments, is a solder.

In embodiments, substrate 102 may comprise a ceramic or crystal such as a laser crystal such as doped sapphire, doped garnet, doped tungstate, or any other type of laser crystal. In this case, light or electricity may be introduced into substrate 102 and emitted as a laser. The crystal may also emit heat as a byproduct of its operation.

In other embodiments, substrate 102 may be a semiconductor that supports (e.g. contains) one or more integrated circuits. As power is applied to the circuits and the circuits operate, they also emit heat as a byproduct of operation. The semiconductor may be silicon, a ceramic semiconductor, a glass semiconductor, or any type of semiconductor that can support an integrated circuit.

Ceramics and crystals often have coefficients of thermal expansion that is less than those of metals. Thus, if substrate 102 is a crystal or ceramic and heat sink 104 is a metal, then heat sink 104 may expand more than substrate 102 when heated. In prior art applications, this inequality in expansion can cause mechanical stress at the interface between substrate 102 and heat sink 104, which may result in damage to the device. Also, in some embodiments, stress on substrate 102 may degrade the operation of substrate 102. For example, if substrate 102 is a Yb:YAG laser crystal, compression or tensile stress on the crystal during operation may decrease the performance of the laser. Note that heat sink 104 may not be heated to as high a temperature as substrate 102 during operation so that heat can be removed from substrate 102 by flowing into heat sink 104. However, because of the potentially great disparity in CTEs between substrate 102 and heat sink 104, the disparity in expansion may still cause mechanical stress.

In some embodiments, heat sink 104 may include a number of cooling channels 108 in fluid connection with a manifold that are arranged to increase the amount of heat that heat sink 104 can remove from substrate 102. As a result, the yield strength of heat sink 104 may be reduced below the ultimate strength of substrate 102 and the heat sink 104 and substrate 102 can be rigidly attached to each other, and their temperatures changed, without damaging the heat producing device or exceeding the bond line strength between the compliant heat sink 104 and the device.

In an embodiment, adhesive 106 may be set in place to rigidly attach the substrate 102 to the heat sink 104 and minimize the thermal resistance of the interface between substrate 102 and heat sink 104. For example, adhesive 106 may be a solder that is placed between substrate 102 and heat sink 104 while they are held at a temperature above the melting point of the solder, then allowed to cool to a predetermined temperature, which may result in a device 100 that has minimal stress between substrate 102 and heat sink 104 during operation. This will be discussed in greater detail below.

Figure 2:
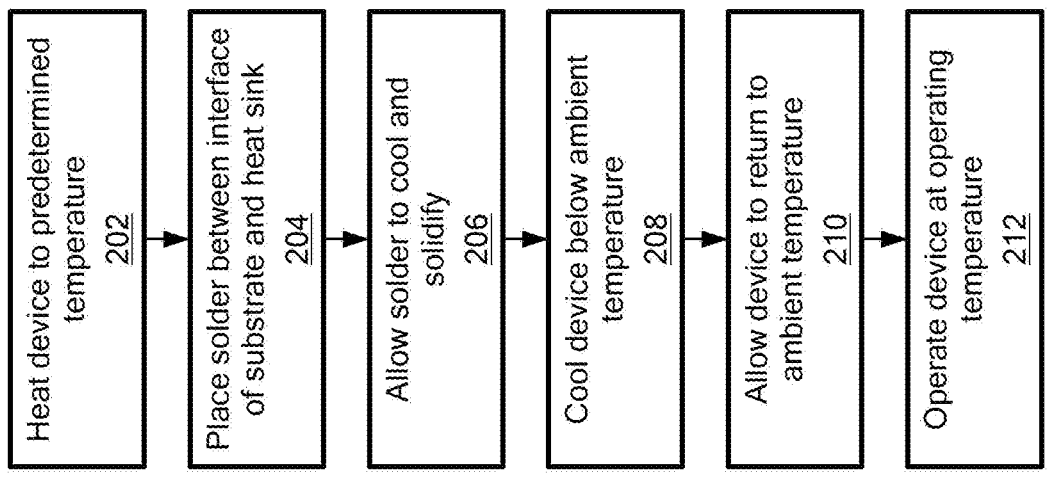
FIG. 2 is a flowchart of a fabrication process for the device in FIG. 1.

Referring now to FIG. 2, a flowchart 200 illustrates a process for fabricating a device 100 that has minimal mechanical stress between substrate 102 and heat sink 104 while the device is operating at a predetermined temperature. In box 202 both substrate 102 and heat sink 104 are heated to a predetermined temperature. This also allows the substrate 102 and heat sink 104 to expand based on their respective CTEs. In an embodiment, the predetermined temperature may be above the melting point of the solder (e.g. adhesive 106) used to couple substrate 102 and heat sink 104 together.

In box 204, the solder in liquid form is placed between substrate 102 and heat sink 104 to form the interface between the two. In box 206, the device and the solder are allowed to cool to the point that the solder solidifies, forming a bond and interface between substrate 102 and heat sink 104. Because substrate 102 and 104 were heated and expanded, the solder may set while substrate 102 and 104 are in their expanded state. As a result, the hardened solder may constrain substrate 102 and heat sink 104 from shrinking to unequal sizes as the device 100 continues to cool. After about 50 degrees C. of cooling, the mechanical stress in heat sink 104 may reach the yield stress of copper. Thus, the stress in heat sink 104 will then remain constant as the device continues to cool to a predetermined minimum cooling temperature.

In box 208, the device is cooled below ambient temperature to the predetermined minimum temperature. As noted above, the mechanical stress in heat sink 104 may remain constant because it has reached the yield stress of the heat sink. If the minimum cooling temperature is lower than room temperature, the stress in substrate 102 and heat sink 104 may be reduced as the device heats up to ambient temperature in box 210. In embodiments, the minimum cooling temperature can be chosen so that the final stress of the components at room temperature is within maximum and minimum tolerances of the substrate 102 and heat sink 104. Thus, at room temperature, any stress in the device is sufficiently low so that the device will not be damaged. Finally, in box 212, device 100 may be operated and brought up to operating temperature. Because of the fabrication process, mechanical stress between substrate 102 and heat sink 104 is minimal at the operating temperature.

Figure 3:
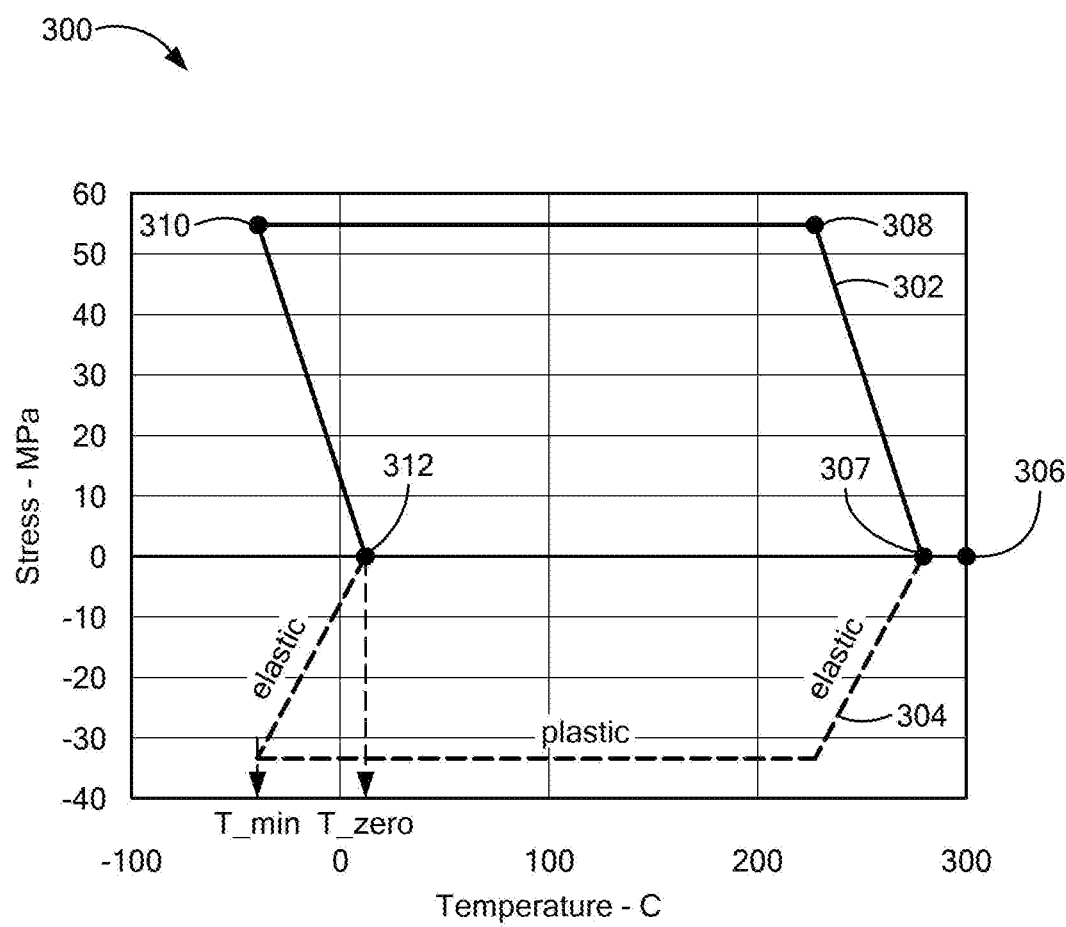
FIG. 3 is a graph of stress in a device during fabrication.

Referring also to FIG. 3, a graph 300 illustrates stresses in substrate 102 and heat sink 104 during the fabrication process outlined in flowchart 200. The vertical axis represents stress in mega-Pascals and the horizontal axis represents temperature in degrees Celsius. Line 302 represents the stress in substrate 102 and line 304 represents the stress in heat sink 104. Of course, the values shown in graph 200 are used as an example and may not apply to every embodiment.

To fabricate device 100, heat sink 104 and substrate 102 may be heated to a temperature 306 above the melting point of the solder used to join heat sink 104 and substrate 102. Device 100 is then allowed to cool to point 307 where the solder sets. As device 100 continues to cool, the mechanical stress in substrate 102 and heat sink 104 increases until point 308. At point 308, the stress 304 in heat sink 102 has reached the yield strength of heat sink 102. Thus, as device 100 continues to cool to minimum cooling point 310, the stress remains constant. As device 100 then warms to point 312 (T_zero) the stress in substrate 102 and heat sink 104 is reduced to substantially zero.

The temperature at point 312 may be chosen to be substantially equal to typical environmental temperature so that, when device 100 is dormant in a normal environment, little to no mechanical stress is evident in device 100. Similarly, minimum cooling point 310 may be chosen so that, during the cooling process, enough plastic deformation occurs within heat sink 104 so when device 100 reaches any predetermined temperature 312, the mechanical stress within device 100 is substantially zero.

Figure 4:
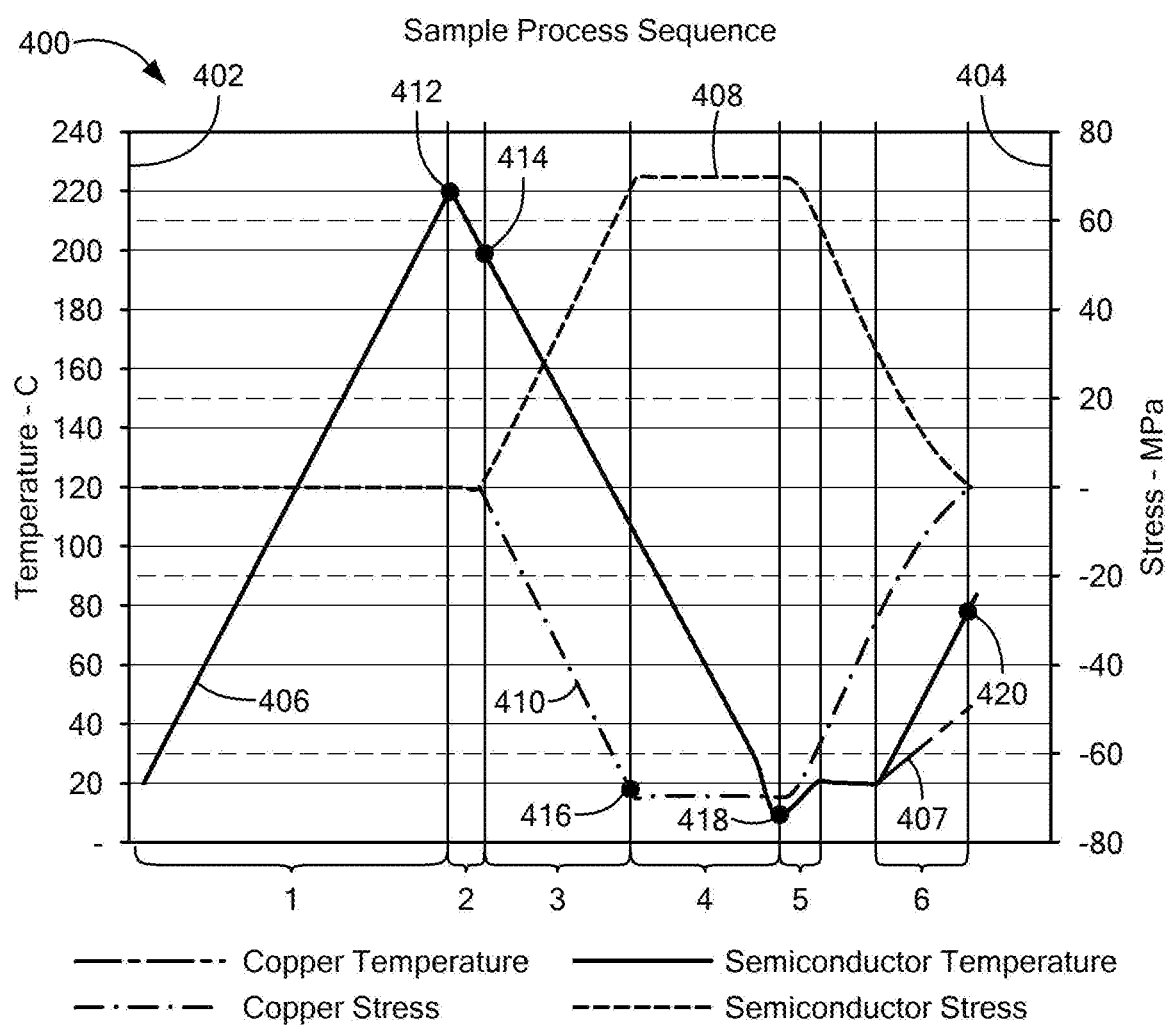
FIG. 4 is a graph of stress and temperature in a device during fabrication.

FIG. 4 includes another graph 400 illustrating the fabrication process. The horizontal axis represents time. The vertical axis 402 represents temperature and vertical axis 404 represents stress at the interface between substrate 102 and heat sink 104, positive values representing compressive stress and negative values representing tensile stress. Line 406 represents temperature of substrate 102, line 407 represents temperature of heat sink 104, line 408 represents mechanical stress on substrate 102, and line 410 represents mechanical stress on heat sink 104. Note that the vertical and horizontal scales are used as examples only and may differ for real-world applications.

During time period 1, the device is heated to a temperature 412 above the melting point of solder. The solder is then placed between heat sink 104 and substrate 102 and, in time period 2, the device is allowed to cool until the solder sets at point 414. In time period 3, the device 100 continues to cool and, due to the differing coefficients of expansion of heat sink 104 and substrate 102, the interface stress increases as shown by lines 408 and 410.

At point 416 the stress on heat sink 104 matches or exceeds the yield strength of heat sink 104. Thus, during time period 4, as the device continues to cool, heat sink 104 exhibits plastic deformation and the stress on heat sink 104 and substrate 102 is constant. Device 100 is cooled to a temperature below ambient at point 418.

In time period 5, device 100 is heated and allowed to return to ambient temperature. During this time, the interface stress is less than the maximum stress shown during time period 4. In some embodiments, when the temperature returns to ambient, the stress on device 100 may be close to zero. Finally, during time period 6, device 100 is in operation and producing heat. As shown, during operation, the average temperature of heat sink 104 is lower than the average temperature of substrate 102. This may be due to normal thermal resistance and other properties of the material of substrate 102 and heat sink 104. However, during operation at point 420, the mechanical stress on device 100 is substantially zero.

Figure 5:
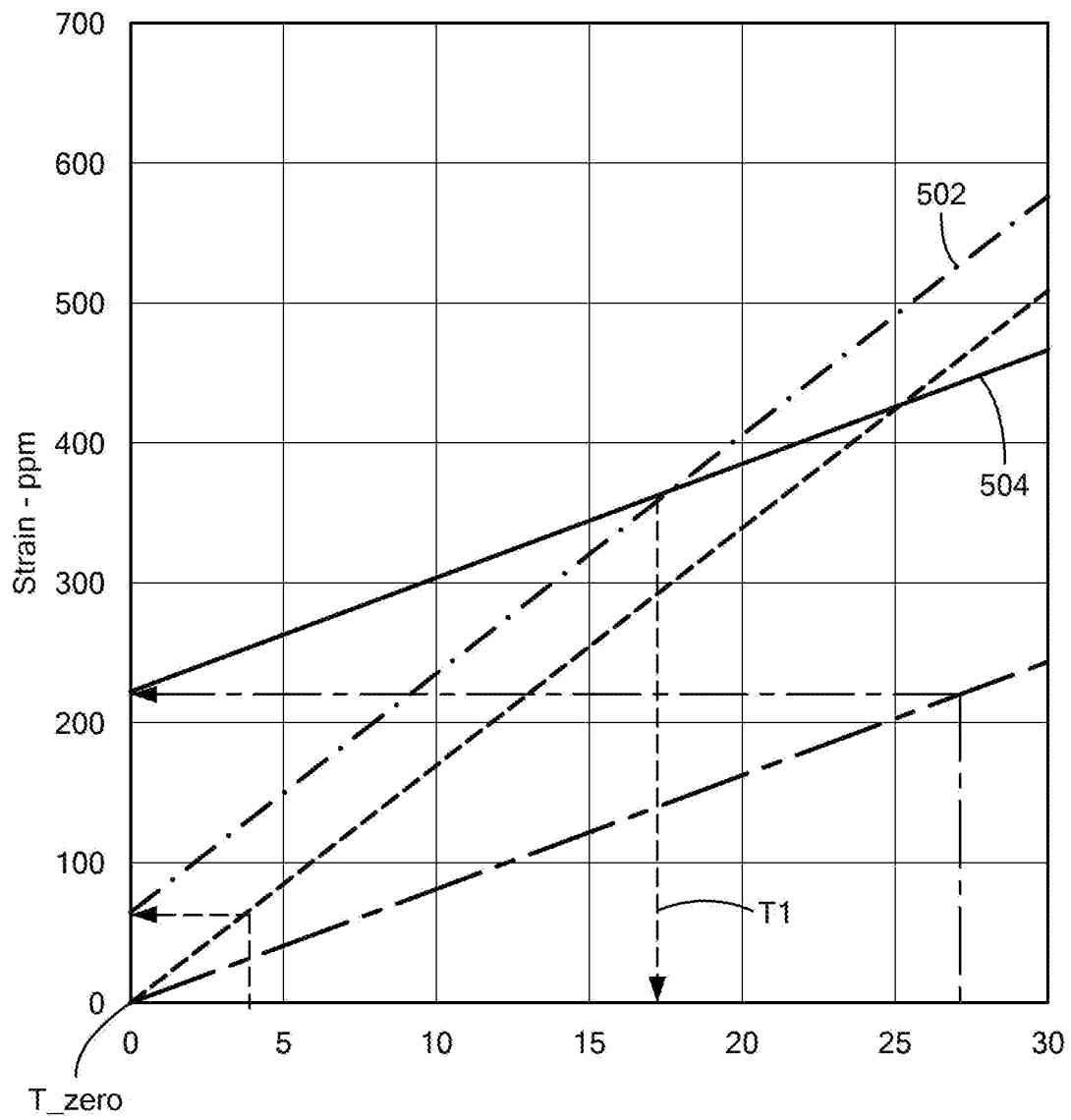
FIG. 5 is a graph of strain in an unconstrained heat sink and substrate as a function of temperature.

FIG. 5 is a graph representing mechanical strain of device 100 during operation as a function of heat sink coolant outlet temperature. As noted above, heat sink 104 may be a fluid-cooled heat sink. Thus, the horizontal axis represents the temperature of the fluid as it exits heat sink 104 and the vertical axis represents mechanical strain.

If the device 100 is unpowered, the system will be isothermal and substrate 102 and heat sink 104 will be at the coolant inlet temperature. The stress and strain of the device 100 and will be zero at the predetermined temperature T_zero. The coolant temperature and flow rate may be controlled so that outlet temperature remains at T_zero when the device is powered. In this case, the heat sink 104 temperature 502 and the device temperature 504 would increase above T_zero. Because heat is conducted through substrate 102 to heat sink 104, the average temperature increase of substrate 102 will be greater than that of heat sink 104. This will result (for example, in the case where substrate 102 is a YAG slab laser) in a higher strain in the substrate 102 than in heat sink 104. As the coolant inlet temperature is increased or the coolant flow rate is decreased, the outlet temperature of the fluid will increase above T_zero. The average temperature of the substrate 102 and the average temperature of the heat sink 104 will increase by the same amount. As a result, strain in substrate 102 and heat sink 104 will also increase. Because the CTE of the substrate 102 is lower than that of the heat sink 104, the increase in strain with temperature may also be lower.

As an example, for a coolant outlet temperature about 17 C above T_zero (e.g. point T1 in graph 500) the strain in both components will be the same. This means that the unconstrained size of the heat exchanger and the device are the same at this temperature and hence the stress at their interface would also be zero if they were rigidly attached to each other. Therefore, to operate with zero stress between the YAG crystal and the heat exchanger, the minimum temperature during the attachment cooldown cycle must be selected to yield a T_zero that is 17 C lower than the intended coolant outlet temperature during operation.

Figure 6:
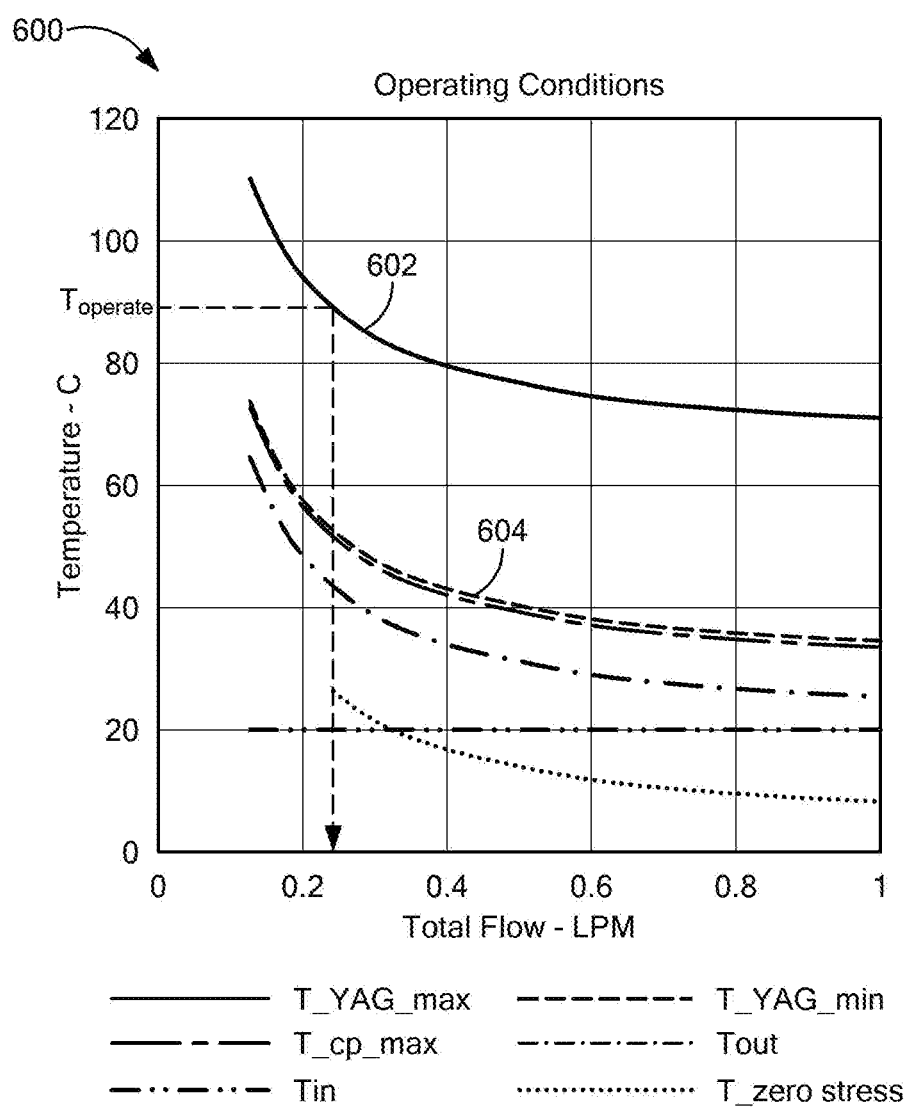
FIG. 6 is a graph of temperature of a device during operation as function of coolant flow.

FIG. 6 is a graph 600 that may illustrate how coolant flow may be used to control temperature during operation and maintain minimal stress within device 100. The vertical axis represents temperature and the horizontal axis represents coolant flow. Line 602 represents the temperature of substrate 102 and line 604 represents the temperature of heat sink 104 in a particular embodiment. Like the other graphs, the scales shown in graph 600 are used for illustrative purposes only. One skilled in the art will recognize that other embodiments within the scope of this disclosure may result in other operating points and graphs.

Graph 600 shows temperature as a function of coolant flow. In this example, while device 100 is operating, a coolant flow of about 0.25 liters per minute may result in substrate 102 operating at the predetermined operating temperature (T-operate) where stress within device 100 are minimized. In some embodiments, the power used during operation may vary and, thus, the operating temperature may try to vary. In such cases, cooling can be controlled with a cooling control circuit that maintains the temperature of substrate 102 at the desired operating temperature.

In embodiments, the use of a material with a higher CTE for the heat sink 104 than for the substrate 102 that is being cooled allows the designer greater control of stress levels. This can be achieved by varying the coolant flow rate in the heat sink. As the coolant flow rate is increased, substrate 102 and heat sink 104 temperatures are all reduced. In some embodiments, the temperature-induced strain of the heat sink is equal to that of the device being cooled at one particular flow, resulting in no stress induced by the heat sink 104. The flow rate that provides zero stress may be shifted by shifting the heat sink's curve up or down (e.g. see curve 502 in FIG. 5). This can be achieved through the heat treating process described above. As the assembly of the heat sink 104 and the substrate 102 is cooled from soldering temperature the heat sink 104 can deform plastically after reaching its elastic tension limit. At rest at room temperature the heat sink 104 will be in tension and the substrate 102 in compression. As the assembly is heated again to operating conditions, the greater relative CTE of the heat sink 104 will tend to reduce stress in the assembly in a linear, elastic fashion. This will continue until a temperature (e.g. point 420 in FIG. 4) where thermal expansion is balanced, and the stress is zero.

Beyond this critical temperature, stresses will rise but with the heat sink 104 in compression and the substrate 102 in tension. The value of the critical temperature for zero stress may be adjusted by controlling the plastic deformation as described above. The critical temperature may be shifted lower by additional tensile plastic deformation in the heat sink 104. This can be accomplished by either isothermally cooling the assembly below room temperature (see e.g. point 310 in FIG. 3) or by rapidly cooling the assembly to create a temperature gradient where the metal heat sink 104 cools faster than the substrate 102. The critical temperature may also be shifted up be reheating the device after initial cool down, beyond the critical temperature, to cause compressive plastic deformation in the heat sink 104.

Those skilled in the art will appreciate that the conception, upon which this disclosure is based, may readily be utilized as a basis for designing other products without departing from the spirit and scope of the invention as defined by the appended claims. Therefore, the claims are not to be limited to the specific examples depicted herein. For example, the features of one example disclosed above can be used with the features of another example.

Furthermore, various modifications and rearrangements of the parts may be made without departing from the spirit and scope of the underlying inventive concept. For example, the geometric configurations disclosed herein may be altered depending upon the application, as may the material selection for the components. Thus, the details of these components as set forth in the above-described examples, should not limit the scope of the claims.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. A device comprising:
   a heat-producing substrate having a first thermal expansion coefficient;
   a heat sink having a second thermal expansion coefficient, wherein the first and second thermal expansion coefficients are different; and
   an interface between the heat-producing substrate and the heat sink formed so that, when the heat-producing substrate is operating at a predetermined temperature, a mechanical stress between the heat-producing substrate and the heat sink is minimized;
   wherein the heat sink has a yield strength that is lower than a yield strength of the heat-producing substrate; and
   wherein the heat sink has been plastically deformed during fabrication by cooling to a temperature where the yield strength of the heat sink is reached and continuing to cool the heat sink to a minimum cooling point determined by the minimum temperature at which enough plastic deformation has occurred within the heat sink such that when the device reaches a predetermined temperature above the minimum cooling point the stress between the heat-producing substrate and the heat sink is minimized to approximately zero.

2. The device of claim 1 wherein the heat-producing substrate comprises a laser crystal.

3. The device of claim 1 wherein the heat-producing substrate comprises at least one electronic circuit.

4. The device of claim 1 wherein the heat sink comprises copper.

5. The device of claim 1 wherein the heat sink is a fluid-cooled heat sink.

6. The device of claim 1 wherein the interface comprises an adhesive.

7. The device of claim 1 wherein the interface comprises a solder.

8. The device of claim 7 wherein the solder is placed between the heat-producing substrate and the heat sink while the heat-producing substrate and the heat sink are held at an elevated temperature.

9. The device of claim 8 wherein the elevated temperature is above a melting point of the solder.

* * * * *